(12) United States Patent
Dietrich

(10) Patent No.: US 7,428,184 B2
(45) Date of Patent: Sep. 23, 2008

(54) CIRCUIT ARRANGEMENT FOR GENERATING AN N-BIT OUTPUT POINTER, SEMICONDUCTOR MEMORY AND METHOD FOR ADJUSTING A READ LATENCY

(75) Inventor: Stefan Dietrich, Türkenfeld (DE)

(73) Assignee: Qimonda AG, Munich (DE)

( * ) Notice: Subject to any disclaimer, the term of this patent is extended or adjusted under 35 U.S.C. 154(b) by 51 days.

(21) Appl. No.: 11/593,234

(22) Filed: Nov. 6, 2006

(65) Prior Publication Data

US 2007/0104014 A1   May 10, 2007

(30) Foreign Application Priority Data

Nov. 9, 2005   (DE) .................. 10 2005 053 486

(51) Int. Cl.
*G11C 8/00* (2006.01)
(52) U.S. Cl. ................ 365/233.1; 365/236; 365/230.06
(58) Field of Classification Search ............. 365/233.1, 365/236, 230.06
See application file for complete search history.

(56) References Cited

U.S. PATENT DOCUMENTS

| 5,655,113 | A   | 8/1997  | Leung et al. |
| 6,215,837 | B1  | 4/2001  | Yi |
| 6,959,016 | B1* | 10/2005 | Keeth et al. .................. 370/517 |

* cited by examiner

*Primary Examiner*—Huan Hoang
(74) *Attorney, Agent, or Firm*—Patterson & Sheridan, L.L.P.

(57) ABSTRACT

A circuit arrangement for generating an n-bit output pointer in a semiconductor memory comprises at least one m-bit interface for accepting an m-bit reference signal, at least one m-bit binary counter, a decoder arrangement connected downstream of the binary counter, and outputs for providing the bits of the output pointer. The reference signal comprises an information regarding a read latency to be adjusted utilizing the output pointer, the at least one counter provides an m-bit counter reading signal comprising a current counter reading, and the decoder arrangement comprises a plurality of decoder devices each comparing the current counter reading signal with a reference value which is associated with a respective of the decoder devices. Each decoder device provides one bit of the output pointer on the basis of the comparing.

14 Claims, 7 Drawing Sheets

US 7,428,184 B2

CIRCUIT ARRANGEMENT FOR GENERATING AN N-BIT OUTPUT POINTER, SEMICONDUCTOR MEMORY AND METHOD FOR ADJUSTING A READ LATENCY

BACKGROUND OF THE INVENTION

The invention relates to a circuit arrangement for generating an n-bit output pointer, in particular for a FIFO-based read latency counter having an adjustable read latency in a semiconductor memory. The invention also relates to a semiconductor memory and to a method for adjusting a read latency.

There is increasingly a need, in modern computer and software applications, to process ever larger volumes of data in an ever shorter period of time. Large-scale integrated memories, for example synchronous dynamic random access memories (S-DRAM memories), are used to store the data. S-DRAMs are standard memory modules which comprise large-scale integrated transistors and capacitors and allow the memory to be accessed without additional waiting cycles.

FIG. 1 of the drawing shows part of the read path of a S-DRAM 1, as is illustrated in German patent No. 102 10 726 B4, in particular in FIG. 1 there. A sense amplifier 3 and an internal data bus 4 are used to read out read data from the memory cell array 2 in clocked fashion using an internal clock signal CLK. A data buffer FIFO 5 is arranged in the read path in order to synchronously output data. The read data which are buffer-stored there are read out from the FIFO 5 using an OCD driver 6 (Off Chip Driver) and are supplied, via an external data bus 7, to a microcontroller, for example, for further processing. The FIFO 5 is driven by the sense amplifier 3 using a read pointer INP and by a read latency generator 8 using an output pointer OUTP that acts as a time-delayed data enable signal.

Signal delays play a significant role in a read access operation. On the one hand, a read-out time tAA is needed to read out the read data RDint from the memory cell array 2 and provide them for the OCD driver 6. A further signal delay results from the propagation time tDP of the read data RDout through the OCD driver 6. The so-called read latency ΔT is defined on the basis of the known signal delays tAA, tDP, said read latency denoting the period of time that is at least needed to read out read data from the memory cell array 2 and provide them at the output of the OCD driver 6 taking into account the signal delays tAA, tDP. The read latency ΔT is generated by the read latency generator 8 which correspondingly shifts the output pointer OUTP relative to the input pointer INP of the FIFO 5 by a minimum number n of clock pulses that corresponds to the read latency ΔT.

These n clock pulses of the read latency ΔT are counted using a read latency counter 8 which is specifically provided for this purpose and, in a corresponding manner, shifts the output counter OUTP relative to the input counter INP by a number n of clock pulses of the clock signal CLK. When implementing a read latency counter, use is usually made of a FIFO-based concept in which the chip-internal read signal RDint is shifted, under the control of the read latency generator 8, by the programmed read latency ΔT and is changed to the domain of the external clock signal DLL-CLK. FIG. 2 of the drawing uses a block diagram to show a FIFO 9 having four individual FIFO cells 9a and thus a FIFO depth of 4. The clock domain is shifted by, for example, the input pointer INP0 opening the cell "0" of the data buffer FIFO, so that the internal data signal RDint is consequently read in there. At the same time, the output counter OUTP1, for example, is active. This results in the internal data signal RDint only being read out from the cell "0" three clock pulses later (see FIG. 3A) assuming that each input pointer INP0-INP3 and each output pointer OUTP0-OUTP3 are respectively alternately active in succession for the duration of one clock pulse.

In modern semiconductor memories, there is increasingly a need to be able to adjust not only an individual read latency ΔT but different read latencies ΔT so that the semiconductor memory can also be operated in different operating modes. In order to then change a read latency ΔT that has been set, the output pointer must be shifted relative to the input pointer. If, in the example described above, the output pointer OUTP2 for the FIFO cell "2", for example, were active rather than the output pointer OUTP1 for the FIFO cell "1", the read data stored in the data buffer FIFO would be read out from the latter one clock pulse earlier, thus corresponding to a read latency that has been reduced by 1.

FIG. 3 shows a block diagram of one implementation of a programmable read latency ΔT for explaining the general problem. In this case, provision is made of a 4-bit ring counter which is denoted using reference symbol 10 and thus has four counter stages 10a and provides a 4-bit counter reading signal CNT0-CNT3 in accordance with the counter reading.

n multiplexer stages 11 are also required for an n-bit output pointer, each multiplexer stage generating one bit of the output pointer OUTP at the output. The inputs of the multiplexer stages 11 are each connected to the outputs of the ring counter 10 in a different order. A multiplexer control signal 11a can be used to select the respective read latency, which is desired or is to be adjusted and is reflected in the output pointer OUTP, by supplying the same control signal 11a to each multiplexer 11 for the purpose of selecting the respective same multiplexer input. The counter reading of the ring counter 10 is respectively injected in a particular order into the inputs of the multiplexer stages 11.

The problem with this implementation is, on the one hand, that, particularly in the case of a multiplicity of read latencies ΔT to be programmed, a corresponding multiplicity of input connections of the multiplexers 11 must be provided. On the other hand, the ring counter 10 also thus becomes very complicated in terms of circuitry since it must have a number of counter stages 10a corresponding to the bit width of the output pointer OUTP. In the case of a multiplicity of such counter stages 10a, the feedback line 10b of the ring counter 10 becomes very long, which results in a diminished performance of the ring counter on account of the signal propagation times. In particular, the ring counter 10 is then increasingly slow. In addition, an ever larger number of multiplexer stages is required, which results in an ever higher load being associated with each bit CNT0-CNT3 of the counter reading signal or the respective output. Correct functionality thus becomes increasingly difficult at high operating frequencies for reading out read data.

This problem arises, in particular, in the case of very large read latencies and very long counter and multiplexer lines, which may result, on the one hand, in longer propagation times of the signals on these lines and, on the other hand, in parasitic capacitances. These are undesirable influences which need to be avoided, in particular when operating large-scale integrated semiconductor memories in the high MHz range and as of the GHz range, since the information stored in the semiconductor memory thus cannot be read out in a defined manner or can be read out only with a considerable amount of additional complexity and/or with the acceptance of data losses during the read-out operation. This is a state which understandably needs to be avoided.

BRIEF DESCRIPTION OF THE INVENTION

In one aspect of the invention, a circuit arrangement for generating an n-bit output pointer, in particular for a FIFO-based read latency counter comprising an adjustable read latency in a semiconductor memory, comprises at least one m-bit interface for injecting a respective m-bit reference signal comprising a respective item of information regarding the read latency to be adjusted using the output pointer, at least one m-bit binary counter which provides, at the output, an m-bit counter reading signal comprising a respective current counter reading, a decoder arrangement which is connected downstream of the binary counter and comprises a first number of decoder devices which each compare the current counter reading signal with a reference value, which is associated with a respective decoder device, and each provide one bit of the output pointer at the output on the basis of the comparison, and n outputs for providing the n bits of the output pointer.

In another aspect of the invention, a semiconductor memory comprises a memory cell array in which read data are stored and a read path in which the following circuit parts are arranged:
- a sense amplifier for reading out the read data stored in the memory cell array,
- a read latency counter which is connected downstream of the output of the sense amplifier and whose read latency is designed to be adjustable using a circuit arrangement as claimed in one of the preceding claims,
- an OCD driver which is connected downstream of the output of the circuit arrangement,
- an output interface at which the read data which have been delayed by the prescribed read latency can be tapped off.

In a further aspect of the invention, a method for adjusting a read latency, which can be adjusted by means of programming, using an inventive circuit arrangement comprises the steps of:
(a) providing a binary m-bit counter reading;
(b) providing a number of binary m-bit reference values which are different from one another and each contain an item of information regarding the read latency which is to be adjusted;
(c) comparing the counter reading, bit by bit, with the reference value that is associated with a decoder device;
(d) outputting a bit for the output pointer on the basis of the comparison;
(e) repeating steps (c) and (d) for each decoder device;
(f) combining the m bits of the m decoder devices to form the output pointer.

The idea on which the present invention is based is to provide a circuit arrangement for generating output pointers for a FIFO-based read latency control circuit that is designed for different read latencies, said circuit arrangement comprising a binary counter instead of a ring counter and comprising a decoder arrangement having decoder devices, which can be adjusted using a reference value, instead of a plurality of multiplexer stages. In this case, the reference value is a measure of the read latency that has respectively been adjusted or programmed.

In the case of the inventive circuit arrangement, a decoder arrangement which can be programmed using an adjustable reference value and is intended to correctly generate the n bits of the output pointer for a read latency counter and, in particular, for the FIFO of the latter is thus described. In this case, the binary counter reading values of a binary counter are compared with a reference signal that depends on the programmed read latency that has been adjusted and, in the case of a match, a corresponding bit of the output pointer is determined. This is carried out in the same manner for all bits of the output pointer using decoder devices which are specifically provided for this purpose.

In comparison with a ring counter, a binary counter has a smaller bit width of the counter reading signal at the output, with the result that it comprises a smaller number of output connections and thus connecting lines. On the other hand, a feedback line, which may become very long from time to time, in particular in the case of a multiplicity of read latencies to be programmed in a corresponding ring counter, is now no longer required.

In addition, considerably fewer buffer memories, which are referred to as latches below, are required when using a binary counter for the counter reading signals which are provided at the output. For example, a total of n=16 output pointer signals are required in the case of a FIFO depth of 16, only m=4 latches (n=$2^m$) instead of the previously required 16 latches now being required as a result of the use of a binary counter. Overall, this means that, in comparison with a ring counter, a binary counter can be designed to be significantly smaller and thus more favorable in terms of chip area.

Furthermore, the multiplexers which have previously been used to combine the output pointer signals are now replaced with a number of decoder devices which are connected downstream of the outputs of the binary counter. In this case, the number corresponds at least to the bit width of the output pointer, each decoder device respectively providing one bit of the output pointer. These decoder devices are designed to compare the value of the counter output bit, which is provided at the output of the binary counter, with corresponding reference bits of a reference signal. The reference signal contains an item of information regarding the respective read latency that is currently set. The respective correct output pointer is present when the current counter value generated by the binary counter matches the reference value that has been set. The bits which are applied to the outputs of the various decoder devices then together produce the correct output pointer for driving the FIFO-based read latency counter which is then designed for the respective programmed read latency that has been adjusted. A programmable n-of-m decoder is thus described in this manner, n=$2^m$.

One embodiment of the invention provides a clock input into which a clock signal, in particular an internal clock signal of the semiconductor memory, can be injected. However, a clock signal which is externally generated, for example by means of a DLL circuit, would also be conceivable. The binary counter is preferably clocked using a clock pulse of this clock signal.

One further embodiment of the inventive circuit provides at least two binary counters. A first binary counter is connected to a first part of the decoder devices and at least one second binary counter is connected to a second part of the decoder devices. This makes it possible to additionally reduce the line lengths for the connecting lines and thus to optimize them as regards their parasitic effects. In addition, this reduces the load that is applied to the outputs of the counter.

A respective reference signal may typically have a respective different binary reference value. The decoder devices are now arranged next to one another in such a manner that the reference values are supplied to said decoder devices, starting with a first decoder device, in ascending or descending order in accordance with the order of the decoder devices which are arranged next to one another. The first decoder device then generates the first (or last) bit of the output pointer, and the last decoder device generates the last (or first) bit of the output pointer.

Another embodiment of the inventive circuit provides for precisely one m-bit interface to be provided for the purpose of injecting only one single m-bit reference signal. The input of this interface may be connected to a first decoder device. In this case, the reference values which are required for the other decoder devices are derived from the reference value of this reference signal. To this end, at least one of the decoder devices is preferably provided with an incrementing circuit which generates a reference value for a further decoder device by incrementing the reference value, which is associated with said decoder device, by a fixed value, said reference value being able to be supplied to the further decoder device. Incrementing is also to be understood as meaning decrementing in this case. The fixed value is preferably plus or minus one. The advantage here is that only one of the decoder devices needs to be provided with an interface for the reference values, which is to be preferred in terms of circuitry.

An alternative embodiment of the inventive circuit provides for each decoder device to have an associated m-bit interface for injecting a respective m-bit reference signal that is associated with this decoder device.

A respective decoder device may typically be designed to carry out a bit-by-bit comparison of the m-bit counter reading signal with the m-bit reference signal that is associated with this decoder device and, if the bit values of the two signals that have been compared with one another match, to set the bit for the output pointer to a first logic level (for example "1") and otherwise to set it to a second logic level (for example "0"). In an embodiment which is relative simple and relative elegant in terms of circuitry, this functionality may be provided by at least one of these decoder devices having an XOR gate with a downstream NOR gate.

One embodiment of the inventive semiconductor memory provides a register in which at least one programmable read latency and/or at least one reference value containing an item of information regarding a respective programmable read latency is/are stored. The present invention is particularly suited to so-called DDR semiconductor memories (DDR=double data rate) and, in particular, to memories for graphics applications in order to satisfy the need of an ever higher data processing speed mentioned at the outset.

BRIEF DESCRIPTION OF THE SEVERAL VIEWS OF THE DRAWINGS

The invention will be explained in more detail below with reference to the exemplary embodiments which are indicated in the diagrammatic figures of the drawing, in which.

DETAILED DESCRIPTION OF THE INVENTION

Figure 1:
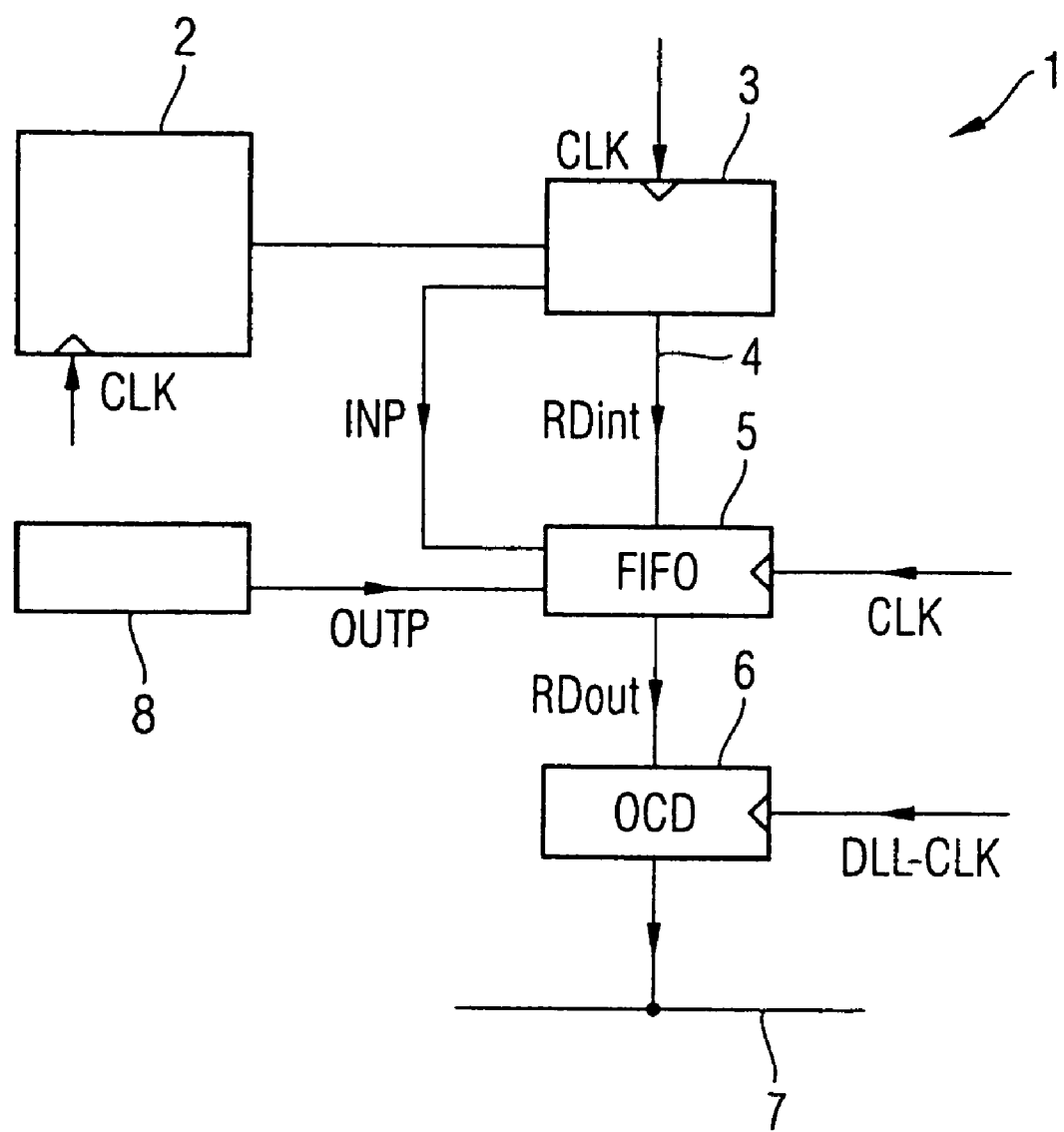
FIG. 1, as discussed above, is a block diagram containing part of a conventional S-DRAM in the region of the read path of the latter.
Figure 2:
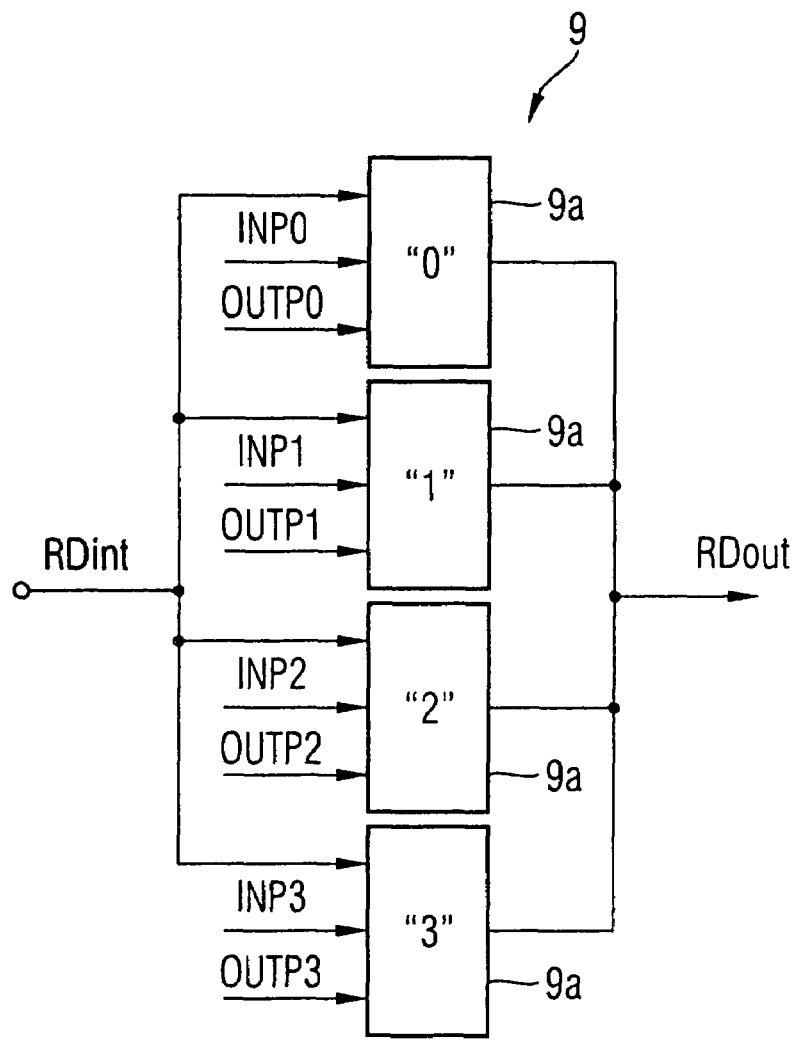
FIGS. 2, 2A, as discussed above, are block diagrams for explaining the general problem of the operation of a read latency counter.
Figure 2A:
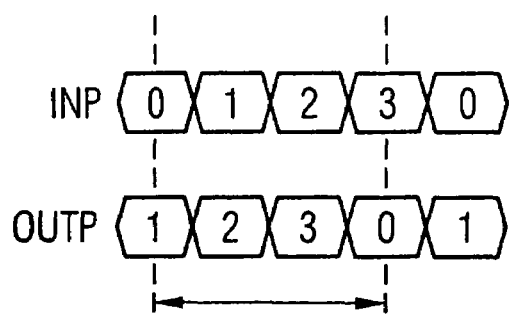
Figure 3:
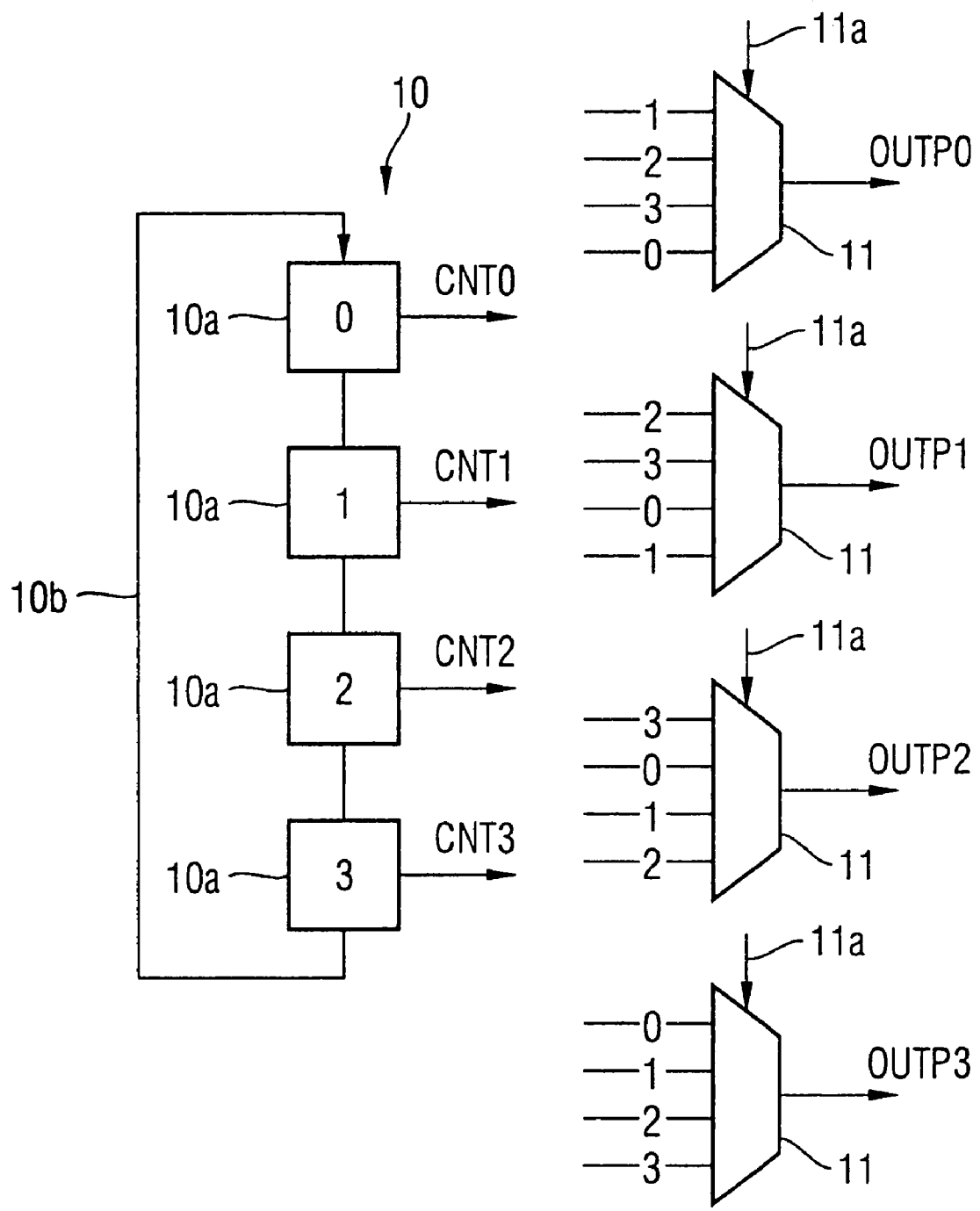
FIG. 3, as discussed above, is a block diagram for explaining the general problem of reducing a programmable read latency.

In the figures of the drawing, identical or functionally identical elements and signals—unless specified otherwise—have been provided with the same reference symbols.

Figure 4:
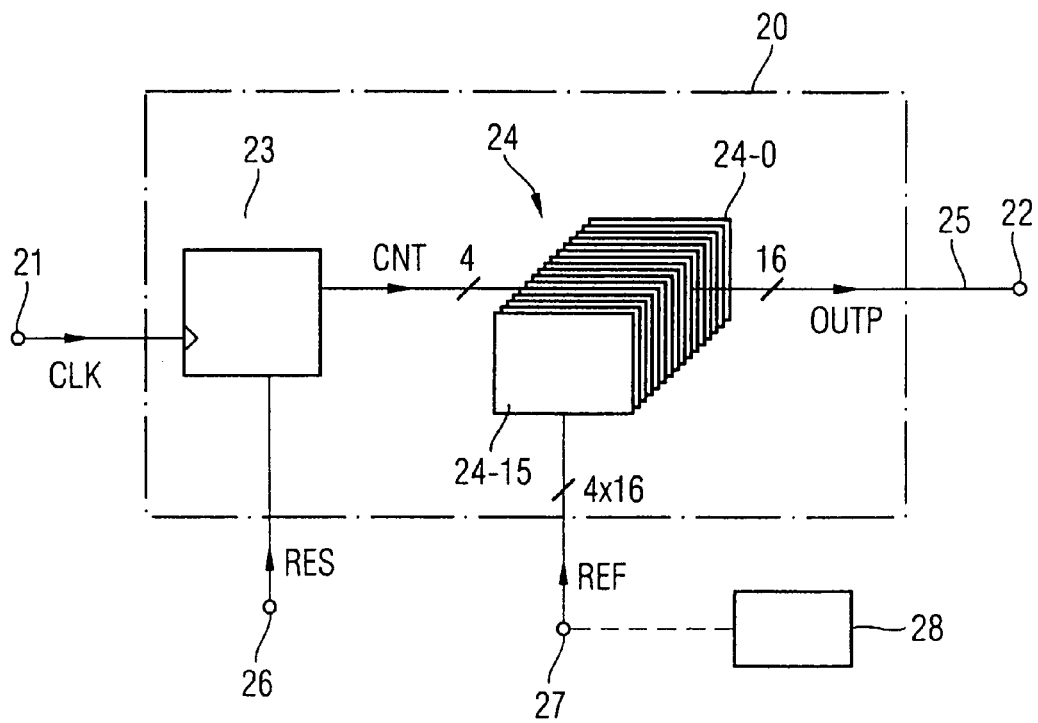
FIG. 4 is a block diagram of an exemplary embodiment of a circuit arrangement for generating output pointers for a FIFO-based read latency control circuit.

FIG. 4 shows a block diagram of a circuit arrangement according to the invention for generating output pointers for a FIFO-based read latency control circuit which is intended to be designed for different read latencies. It shall be assumed that the FIFO-based read latency control circuit (not illustrated in FIG. 4) has a data buffer FIFO having a FIFO depth of 16. The circuit arrangement according to the invention is thus designed to provide a 16-bit output pointer.

In this case, the circuit arrangement according to the invention is denoted using reference symbol 20. The circuit arrangement 20 has a clock input 21 and an output 22. An internal clock signal CLK can be injected via the clock input 21. The output 22 has n=16 parallel output connections which can be used to tap off an output pointer signal or a 16-bit output pointer OUTP.

A binary counter 23 whose input is supplied with the clock signal CLK is arranged between the clock input 21 and the outputs 22. The binary counter 23 is in the form of a 4-bit binary counter (m=4) and generates a 4-bit counter reading signal CNT at the output. The circuit arrangement 20 according to the invention also comprises a decoder arrangement 24 having a total of 16 decoder devices 24-0 to 24-15 which are arranged parallel to one another and whose inputs are respectively connected to the counter outputs of the binary counter 23. Each of the decoder devices 24-0 to 24-15 is connected to one of the output connections 22 via a respective connecting line 25, with the result that, overall, each decoder device 24-0 to 24-15 provides one bit for the 16-bit output pointer OUTP. The output pointer signal OUTP is present at the outputs 22 in thermometer-coded form.

The binary counter 23 also has a reset input 26 for injecting a reset signal RES which can be used to reset the binary counter 23 to an initial counter reading, for example to "0000".

The circuit arrangement 20 according to the invention also contains reference inputs 27. The reference inputs 27 can be used to supply a respective reference signal REF to each decoder device 24-0 to 24-15. In the present exemplary embodiment, the reference signals REF have the same bit width as the counter reading signal CNT, that is to say a bit width of 4 in the present exemplary embodiment. Each reference signal REF prescribes a reference value which has a width of 4 bits and is supplied, as a reference, to the respective decoder device 24-0 to 24-15. In the example in FIG. 4, a number of n-bit reference signals which are each different from one another are thus supplied to the decoder arrangement 24, said number corresponding to the number n of decoder device. The respective binary reference values of these reference signals are described below with reference to tables 1 and 2. The respective reference value REF contains an item of information regarding the desired read latency that is intended to be used for the FIFO-based read latency control circuit and is thus intended to be used by the output pointer OUTP to drive the data buffer FIFO for the purpose of reading out the read data. This read latency is typically stored in a register that is specifically provided for this purpose, for example a mode register 28 that is merely indicated in FIG. 4. Like the read latency control circuit and the corresponding data buffer FIFO, the mode register 28 is typically part of a large-scale integrated semiconductor memory.

Figure 5:
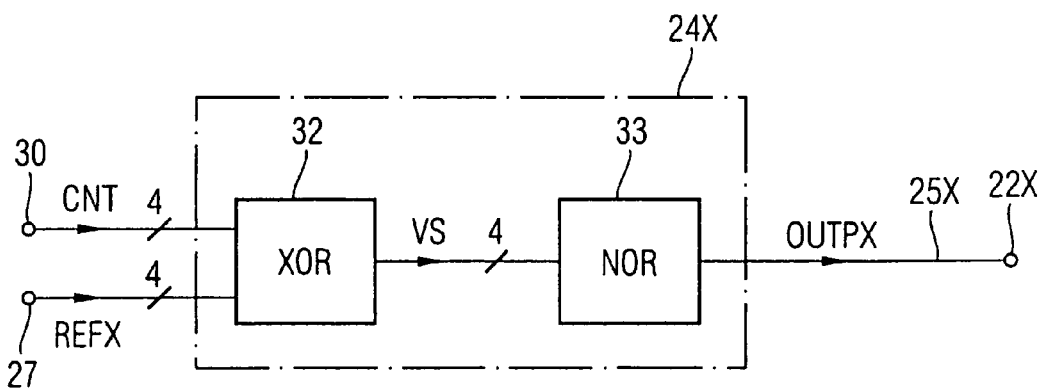
FIG. 5 is a block diagram of an individual decoder device of the circuit arrangement of FIG. 4.

FIG. 5 shows a block diagram of an individual decoder device 24 of a decoder arrangement 24 from FIG. 4, which is thus designed to generate, at the output, an individual bit for the output pointer OUTP. The index "X" is intended to indicate here that it is respectively the X-th decoder device 24X, output connection 22X or output line 25X. The decoder device 24X contains a counter input 30 for injecting the respective 4-bit counter reading signal CNT and a reference input 31 for injecting the 4-bit reference signal REF. In this exemplary embodiment, the decoder device 24X is in the form of a gate and contains, on the input side, an XOR gate 32 and, on the output side, a NOR gate 33. The input of the XOR gate 32 is supplied with the counter reading signal CNT and the reference signal REF whose individual bits are XORed in the XOR gate 32. Depending on this, the XOR gate 32 provides a 4-bit comparison signal VS at the output, which are correspondingly NORed in the downstream NOR gate 33. The NOR gate 33 generates, at the output, an individual bit OUTPX for the output pointer OUTP.

Figure 6:
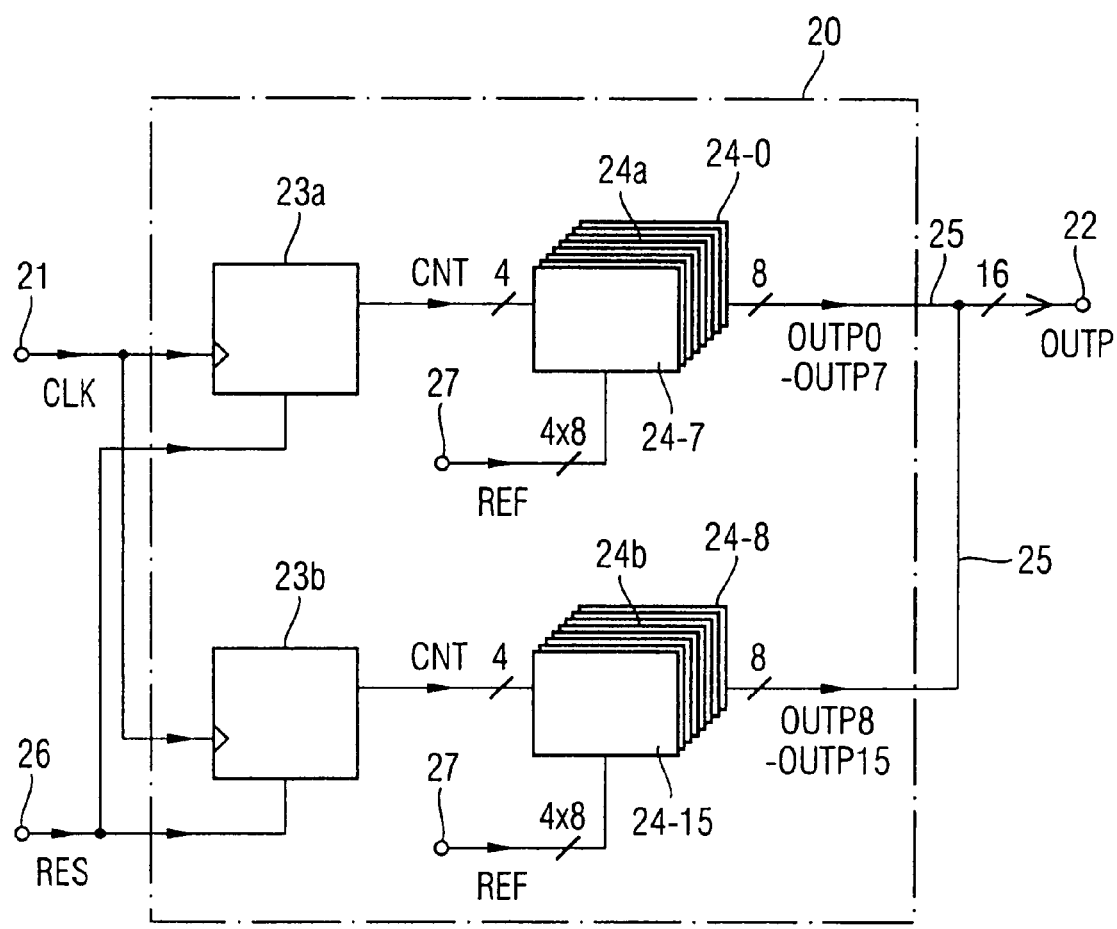
FIG. 6 is a block diagram of a further exemplary embodiment of the circuit arrangement of for generating output pointers for a FIFO-based read latency control circuit.

FIG. 6 uses a block diagram to show a further exemplary embodiment of a circuit arrangement 20 according to the invention. In contrast with the exemplary embodiment in FIG. 4, the circuit arrangement 20 is in two parts in this case and has two binary counters 23*a*, 23*b*. Eight decoder devices 24*a*, 24*b* are respectively connected downstream of each binary counter 23*a*, 23*b*. The first (top) eight decoder devices 24*a* are designed to generate the first eight bits OUTP0-OUTP7 for the output pointer OUTP, whereas the second (bottom) eight decoder devices 24*b* are intended to generate the remaining eight bits OUTP8-OUTP15 of the output pointer OUTP. In this case, the individual decoder devices 24 are driven using the corresponding reference signals REF, and the corresponding binary counters 23*a*, 23*b* are driven using the clock signal CLK and the reset signal RES, in an analogous manner to the exemplary embodiments in FIGS. 4 and 5.

Figure 7:
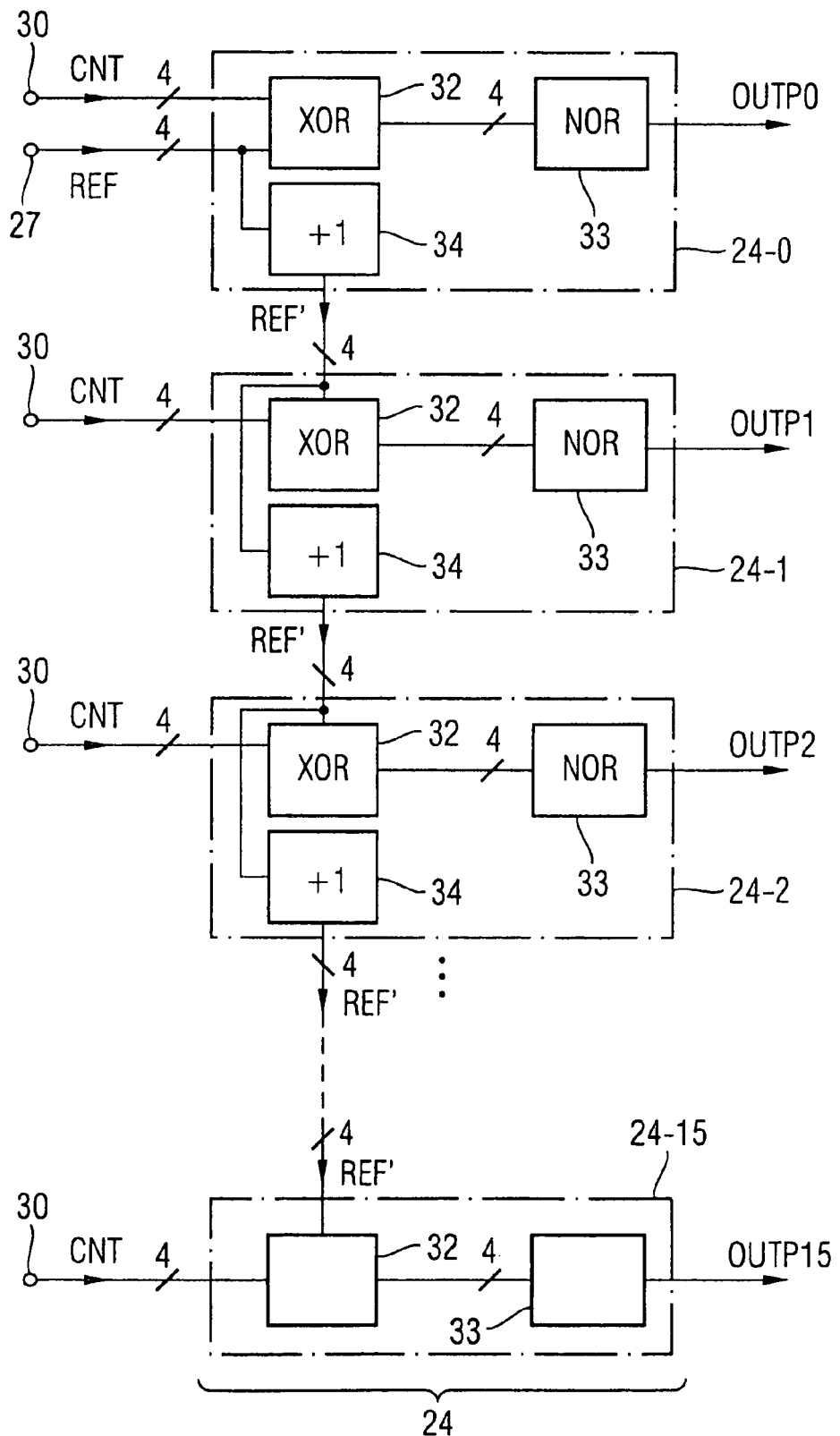
FIG. 7 is a block diagram of a further exemplary embodiment of a decoder arrangement of a circuit arrangement of FIG. 4.

FIG. 7 shows another exemplary embodiment of a decoder arrangement of a circuit arrangement according to the invention as shown in FIG. 4. In this case, in addition to the respective XOR gates 32 and NOR gates 33, each decoder device 24-0 to 24-14—with the exception of the decoder device 24-15—contains a device 34 for incrementing a respective input signal by "+1".

In contrast to the exemplary embodiment in FIG. 5, only the first decoder device 24-0 has a reference input 27 into which a reference signal REF is injected. The other decoder devices 24-1 to 24-15 are not connected to the reference input 27. They receive their respective reference value REF' from the respective preceding decoder device 24-0 to 24-14 by virtue of the reference value that is provided for a respective decoder device 24-1 to 24-15 being obtained from the reference value for a respective preceding decoder device 24-0 to 24-14 by incrementing the reference value of the latter by "+1". It is thus sufficient for only one decoder devices 24-0, for example the first decoder device 24-0, to be supplied with an external reference signal REF containing an item of information regarding the read latency. This makes it possible to significantly simplify the circuit topology since it is now possible to dispense with very long connecting lines for supplying the different reference signals to the other decoder device 24-0 to 24-15. This is particularly advantageous, in particular, in those circuit topographies which are designed for a large read latency.

The method of operation of a decoder arrangement 24 according to FIG. 8 will be explained below:

The individual bits of the output pointer 5 OUTP activate the individual FIFO cells of a data buffer FIFO in a sequential sequence. If the binary counter 23 has been initialized to an initial starting value of <0000>, this means that the sequence for activating the FIFO cells must be represented as in the following table 1:

TABLE 1

| Decimal value of the output pointer | Counter reading (binary) |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |
| 15 | 1111 |
| 0 | 0000 |
| ... | ... |

However, if the output pointer "4" is then intended to be activated first, the reference value in the corresponding decoder device 24-4 must be equal to the starting value of the binary counter 23. For initialization to <0000>as shown in the above table 1, the reference value would thus be REF4=<0000>. Since the sequence must still be retained, it follows that the reference values following the reference value REF4=<0000>must each be increased by +1, that is to say incremented by +1. This is illustrated in the following table 2 for the example in which the output pointer "4" is intended to be activated first.

TABLE 2

| Decimal value of the output pointer | Counter reading (binary) | Reference value (binary) |
|---|---|---|
| 4 | 0000 | 0000 |
| 5 | 0001 | 0001 |
| 6 | 0010 | 0010 |
| 7 | 0011 | 0011 |
| 8 | 0100 | 0100 |
| 9 | 0101 | 0101 |
| 10 | 0110 | 0110 |
| 11 | 0111 | 0111 |
| 12 | 1000 | 1000 |
| 13 | 1001 | 1001 |
| 14 | 1010 | 1010 |
| 15 | 1011 | 1011 |
| 0 | 1100 | 1100 |
| 1 | 1101 | 1101 |
| 2 | 1110 | 1110 |
| 3 | 1111 | 1111 |
| 4 | 0000 | 0000 |
| ... | ... | |

Table 2 shows that, with these requirements, the decoder device associated with the output pointer "0" now has the value <1100>as the reference value. In order to initialize the system, only the respective first decoder device 24-0 must thus be loaded with the respective reference value <1100>and all of the following decoder device 24-1 to 24-15 receive the respective reference value that has been incremented by +1. In order to program another read latency, only the reference value of the first decoder device 24-0 must be correspondingly changed, the other decoder device 24-1 to 24-15 being correctly adjusted in a corresponding manner using incrementation.

Figure 8:
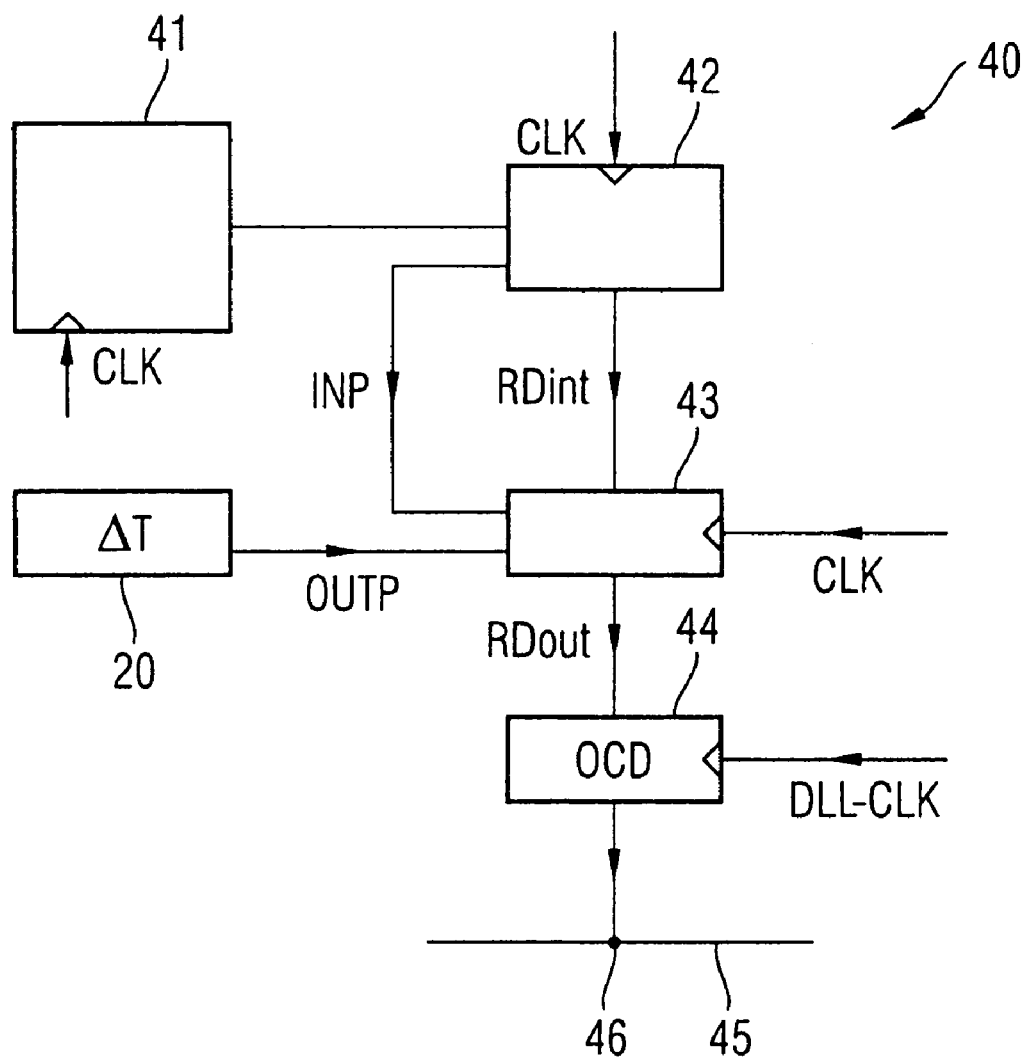
FIG. 8 is a block diagram of a semiconductor memory comprising an inventive circuit arrangement.

FIG. 8 shows a block diagram of a semiconductor memory having a circuit arrangement according to the invention in the region of its read path. The semiconductor memory 40 has a memory cell array 41 from which read data RDint can be read out during a read access operation. A sense amplifier 42, a read latency counter 43, an OCD driver 44 and an output interface 46, which is connected to an external bus 45, are arranged in succession in the read path. The read latency counter 43 is read using an output pointer OUTP. According to the invention, the output pointer OUTP can be adjusted to the desired read latency, which is stored in a mode register 20, for example, in accordance with said desired read latency. A circuit arrangement 20 according to the invention is provided for this purpose.

Although the present invention was explained in more detail above with reference to preferred exemplary embodiments, it is not restricted thereto but rather may be multifariously modified. In particular, the circuit arrangement according to the invention and thus its binary counter and decoder arrangement as well have been deliberately described in a very simple manner in terms of circuitry. It goes without saying that these circuit parts may also be modified without departing from the fundamental essence of the invention. It also goes without saying that the numerical specifications indicated, for example the use of 16 decoder devices, reference values and the like, have been selected only by way of example in order to describe the present exemplary embodiment with reference to a FIFO depth of 16. In addition, it is also conceivable to implement a smaller or larger FIFO depth by means of a different number of decoder devices and also by dividing the decoder devices in a different manner.

What is claimed is:

1. A circuit arrangement for generating an n-bit output pointer in a semiconductor memory, comprising:
   at least one m-bit interface for accepting an m-bit reference signal which comprises an information regarding a read latency to be adjusted utilizing an output pointer to be generated by said circuit arrangement;
   at least one m-bit binary counter comprising a counter output and providing an m-bit counter reading signal comprising a current counter reading at said counter output;
   a decoder arrangement which is connected downstream of said binary counter, comprising a decoder output, and a plurality of decoder devices each comparing said current counter reading signal with a reference value which is associated with a respective of said decoder devices; each of said decoder devices providing one bit of said output pointer at said decoder output on the basis of said comparing; and
   n outputs for providing said n bits with said output pointer; and
   wherein the at least one m-bit interface comprises a plurality of m-bit interfaces, each injecting an m-bit reference signal; each of said reference signals comprising a different binary reference value, said decoder devices being arranged next to one another in such a manner that said reference values are supplied to said decoder devices in ascending or descending order.

2. The circuit arrangement of claim 1, further comprising a clock input into which a clock signal is injected and said binary counter being clocked utilizing a clock pulse of said clock signal.

3. The circuit arrangement of claim 2, wherein said clock signal is an internal clock signal of said semiconductor memory.

4. The circuit arrangement of claim 1, further comprising, as said at least one binary counter, a first binary counter and at least one second binary counter; said first binary counter being connected to a first part of said decoder devices and said at least one second binary counter being connected to a second part of said decoder devices.

5. The circuit arrangement of claim 1, wherein each of said decoder devices comprises an associated of said m-bit interfaces for injecting a respective m-bit reference signal that is associated with the relevant of said decoder devices.

6. The circuit arrangement of claim 1, wherein a given of said decoder devices carries out a bit-by-bit comparison of said m-bit counter reading signal with said m-bit reference signal that is associated with said given decoder device and, if bit values of said counter reading and reference signals match, sets a bit for said output pointer to a first logic level and otherwise sets said bit to a second logic level.

7. The circuit arrangement of claim 1, wherein at least one of said decoder devices comprises an XOR gate with a downstream NOR gate.

8. A semiconductor memory comprising
   a memory cell array in which read data are stored; and
   a read path in which the following circuit parts are arranged;
   a sense amplifier for reading out said read data stored in said memory cell array; said sense amplifier comprising an amplifier output;
   a read latency counter connected downstream of said amplifier output; a read latency of said latency counter being designed to be adjustable utilizing said circuit arrangement of claim 1;
   an OCD driver connected downstream of an output of said circuit arrangement;
   an output interface at which said read data which have been delayed by the prescribed read latency can be tapped off.

9. A method for adjusting a read latency being adjustable by means of programming and utilizing said circuit arrangement of claim 1, comprising the steps of:
   (a) providing a binary m-bit counter reading;
   (b) providing a plurality of binary m-bit reference values which are different from one another and each comprising an information regarding said read latency which is to be adjusted;
   (c) comparing said counter reading, bit by bit, with said reference value associated with a relevant of said decoder devices;
   (d) outputting a bit for said output pointer on the basis of said comparing;
   (e) repeating steps (c) and (d) for each of the remaining of said decoder devices; and
   (f) forming said output pointer by combining said bits of said decoder devices.

10. A circuit arrangement for generating an n-bit output pointer in a semiconductor memory, comprising:
    at least one m-bit interface for accepting an m-bit reference signal which comprises an information regarding a read latency to be adjusted utilizing an output pointer to be generated by said circuit arrangement;

at least one m-bit binary counter comprising a counter output and providing an m-bit counter reading signal comprising a current counter reading at said counter output;

a decoder arrangement which is connected downstream of said binary counter, comprising a decoder output, and a plurality of decoder devices each comparing said current counter reading signal with a reference value which is associated with a respective of said decoder devices; each of said decoder devices providing one bit of said output pointer at said decoder output on the basis of said comparing;

n outputs for providing said n bits with said output pointer; and wherein said at least one m-bit interface is a single m-bit interface comprising an interface input connected to one of said decoder devices; said reference values required for the remaining of said decoder devices being derived from said reference value of said reference signal generated by said single m-bit interface.

11. The circuit arrangement of claim 10, wherein at least one of said decoder devices comprises an incrementing circuit generating said reference value for another of said decoding devices by incrementing said reference value associated with said decoder device comprising said incrementing circuit by a fixed value.

12. The circuit arrangement of claim 11, wherein said fixed value equals one.

13. A semiconductor memory comprising:
a memory cell array in which read data are stored; and
a read path in which the following circuit parts are arranged;
a sense amplifier for reading out said read data stored in said memory cell array; said sense amplifier comprising an amplifier output;
a read latency counter connected downstream of said amplifier output; a read latency of said latency counter being designed to be adjustable utilizing a circuit arrangement, said circuit arrangement comprising:
  (a) at least one m-bit interface for accepting an m-bit reference signal which comprises an information regarding a read latency to be adjusted utilizing an output pointer to be generated by said circuit arrangement;
  (b) at least one m-bit binary counter comprising a counter output and providing an m-bit counter reading signal comprising a current counter reading at said counter output,
  (c) a decoder arrangement which is connected downstream of said binary counter, comprising a decoder output, and a plurality of decoder devices each comparing said current counter reading signal with a reference value which is associated with a respective of said decoder devices; each of said decoder devices providing one bit of said output pointer at said decoder output on the basis of said comparing; and
  (d) n outputs for providing said n bits with said output pointer;
an OCD driver connected downstream of an output of said circuit arrangement;
an output interface at which said read data which have been delayed by the prescribed read latency can be tapped off; and
wherein provision is made of a register in which at least one of an at least one programmable read latency or at least one reference value comprising an information regarding a respective programmable read latency is stored.

14. A method for adjusting a read latency being adjustable by means of programming and utilizing a circuit arrangement, the method comprising:
  (a) providing a circuit arrangement comprising:
    (i) at least one m-bit interface for accepting an m-bit reference signal which comprises an information regarding a read latency to be adjusted utilizing an output pointer to be generated by said circuit arrangement;
    (ii) at least one m-bit binary counter comprising a counter output and providing an m-bit counter reading signal comprising a current counter reading at said counter output,
    (iii) a decoder arrangement which is connected downstream of said binary counter, comprising a decoder output and a plurality of decoder devices each comparing said current counter reading signal with a reference value which is associated with a respective of said decoder devices; each of said decoder devices providing one bit of said output pointer at said decoder output on the basis of said comparing; and
    (iii) n outputs for providing said n bits with said output pointer;
  (b) providing a binary m-bit counter reading;
  (c) providing a plurality of binary m-bit reference values which are different from one another and each comprising an information regarding said read latency which is to be adjusted;
  (d) comparing said counter reading, bit by bit, with said reference value associated with a relevant of said decoder devices;
  (e) outputting a bit for said output pointer on the basis of said comparing;
  (f) repeating steps (c) and (d) for each of the remaining of said decoder devices;
  (g) forming said output pointer by combining said bits of said decoder devices;
  (h) providing a single reference signal as said at least one reference signal; said single reference signal comprising a first of said reference values for one of said decoder devices; and
  (j) generating the remaining of said reference values for the remaining of said decoder devices by successively incrementing said first reference value.

* * * * *